United States Patent [19]
Sredanovic

[11] Patent Number: 5,956,276
[45] Date of Patent: Sep. 21, 1999

[54] SEMICONDUCTOR MEMORY HAVING PREDECODER CONTROL OF SPARE COLUMN SELECT LINES

[75] Inventor: Nikolas Sredanovic, Mountain View, Calif.

[73] Assignee: Mosel Vitelic Corporation, San Jose, Calif.

[21] Appl. No.: 09/153,787

[22] Filed: Sep. 16, 1998

[51] Int. Cl.[6] ........................................... G11C 7/00
[52] U.S. Cl. .................. 365/200; 365/225.7; 365/230.06
[58] Field of Search ................... 365/200, 225.7, 365/230.06, 189.02, 189.01

[56] References Cited

U.S. PATENT DOCUMENTS 5,455,798  10/1995  McClure ................................. 365/200
5,471,426  11/1995  McClure ................................. 365/200
5,812,466   9/1998  Lee et al. ............................... 365/200

*Primary Examiner*—David Nelms
*Assistant Examiner*—David Lam
*Attorney, Agent, or Firm*—Townsend and Townsend and Crew LLP; Henry K. Woodward

[57] ABSTRACT

A decoder for use in addressing a spare column select line for use in a semiconductor random access memory includes a plurality of input lines each connected to a Y predecoder line, each input line including a pass gate for passing the bit connected thereto in response to an enable signal and a fuse link serially connected with a pass gate, a plurality of fuse links being connected in parallel to provide one of a first plurality of address inputs, a logic gate for receiving said first plurality of address inputs from said plurality of input lines and generating a spare column select signal, whereby all decoder pass gates are disabled until the spare word line is selected for use, the address for the spare line being defined by ablation of fuse links in unwanted Y predecoder lines.

2 Claims, 3 Drawing Sheets

SEMICONDUCTOR MEMORY HAVING PREDECODER CONTROL OF SPARE COLUMN SELECT LINES

BACKGROUND OF THE INVENTION

This invention relates to semiconductor integrated circuit random access memories (RAM), and more particularly the invention relates to improved control of spare column lines in such memories.

The semiconductor memory is organized in a matrix defined by word lines and bit lines organized in rows and columns. A cell in the memory array is addressed by a Y or column select address and an X or row select address.

Often a column line in a memory can be defective. Heretofore, spare column lines have been provided for replacing defective column select lines so that the memory device does not have to be scrapped. Usually each spare column line is dedicated to one sub-array and is not useable throughout the memory. For example, in a memory with 256 column lines, eight spare column lines might be provided with each spare column line dedicated for use in a sub-array of only 32 column lines.

In synchronous graphics dynamic random access memories (SGRAM), column select addresses include information in addition to the line address, and special logic in predecoders is required to re-format and identify the address. Heretofore, column spare decoders have included the logic necessary to decode the Y addresses. Further, some prior art spare column line decoders consume power even when a spare has not been selected.

SUMMARY OF THE INVENTION

In accordance with the invention, each column line spare is connectable to every column line address whereby each spare can be used throughout a memory array, thereby enhancing the usefulness of each spare. Fuse links are employed to connect all Y predecoder lines to a spare, and by selective laser ablation of fuse links, a spare can be connected to a specific column line address and thereby replace a defective column line at the address. Pass gates are employed to prevent connection of any Y predecoder lines until the spare line is to be enabled and thus reduce power consumption. All pass gates are responsive to enable spare signals (MEN,$\overline{\text{MEN}}$).

In a preferred embodiment for a Synchronous Graphics RAM, the spare column line block is connected to a Y predecoder whereby the logic for the Y predecoder is used by the spare decoder and reduces the logic circuitry required by the spare decoder.

The invention and objects and features thereof will be more readily apparent from the following detailed description and the appended claims when taken with the drawings.

DETAILED DESCRIPTION OF ILLUSTRATIVE EMBODIMENT

Figure 1:
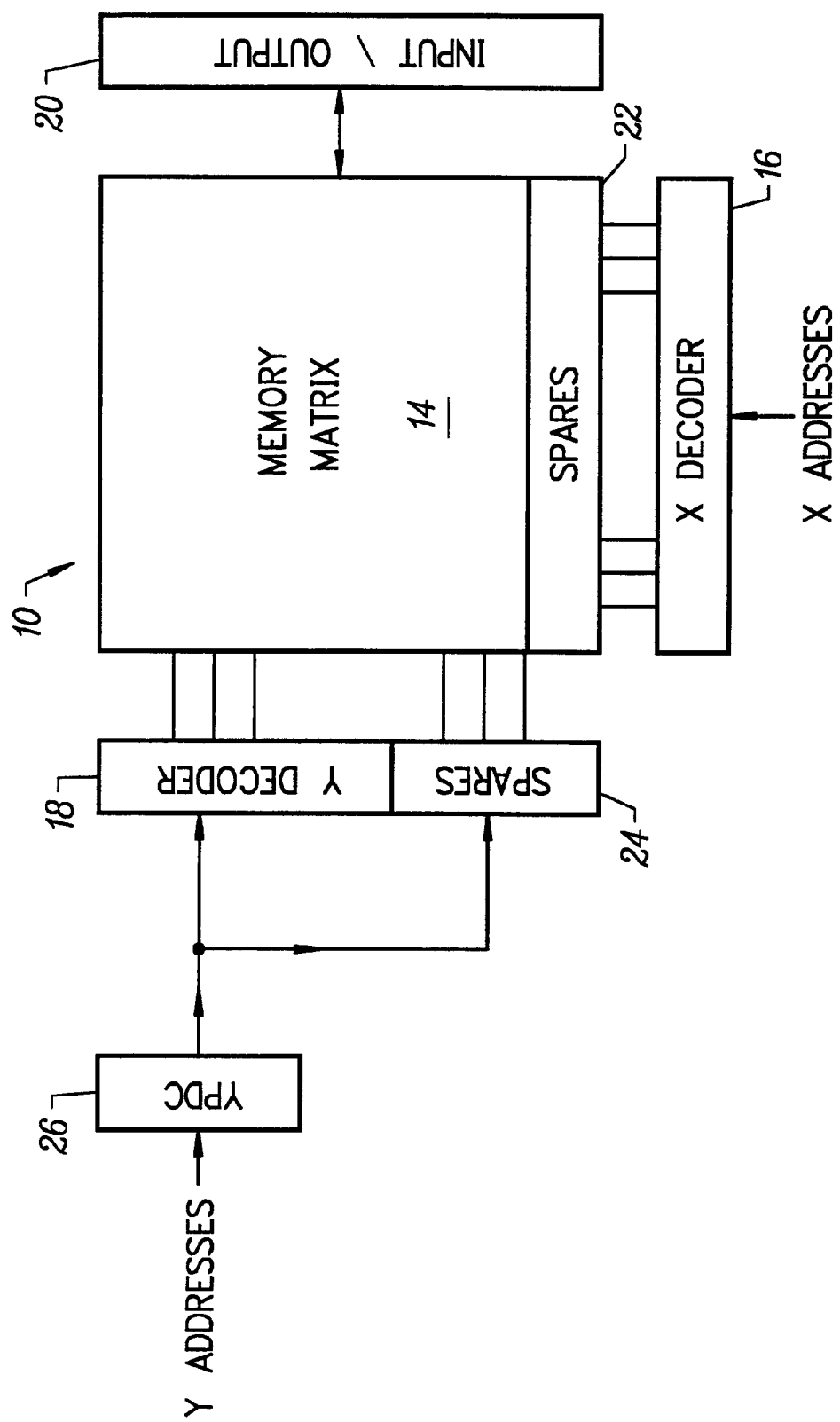
FIG. 1 is a functional block diagram of an SGRAM including spare addressing in accordance with one embodiment of the invention.

Referring now to the drawings, FIG. 1 is a functional block diagram of a synchronous DRAM shown generally at 10 including a spare decoder in accordance with one embodiment of the invention. A memory matrix 14 includes a plurality of column lines which are addressed by a Y decoder 18 and a plurality of word lines which are addressed by an X decoder 16. An input/output block 20 accesses memory matrix 14 for receiving stored data or for applying data for storage in the memory matrix.

Memory matrix 14 includes a plurality of spare column lines 22 for use in replacing defective column lines. Y decoder 18 includes a spare address portion 24 for addressing one or more spare column lines when other column lines of the memory matrix 14 are defective. Spare decoder 24 is employed to recognize an address for a defective column line and enable a spare column line as a replacement. Predecoder 26 includes logic circuitry necessary in processing addresses in a synchronous DRAM memory such as a synchronous graphics DRAM (SGRAM). Accordingly, spares 24 can utilize the logic circuitry of predecoder 26 and thus reduce circuitry of the spares decoder.

Figure 2:
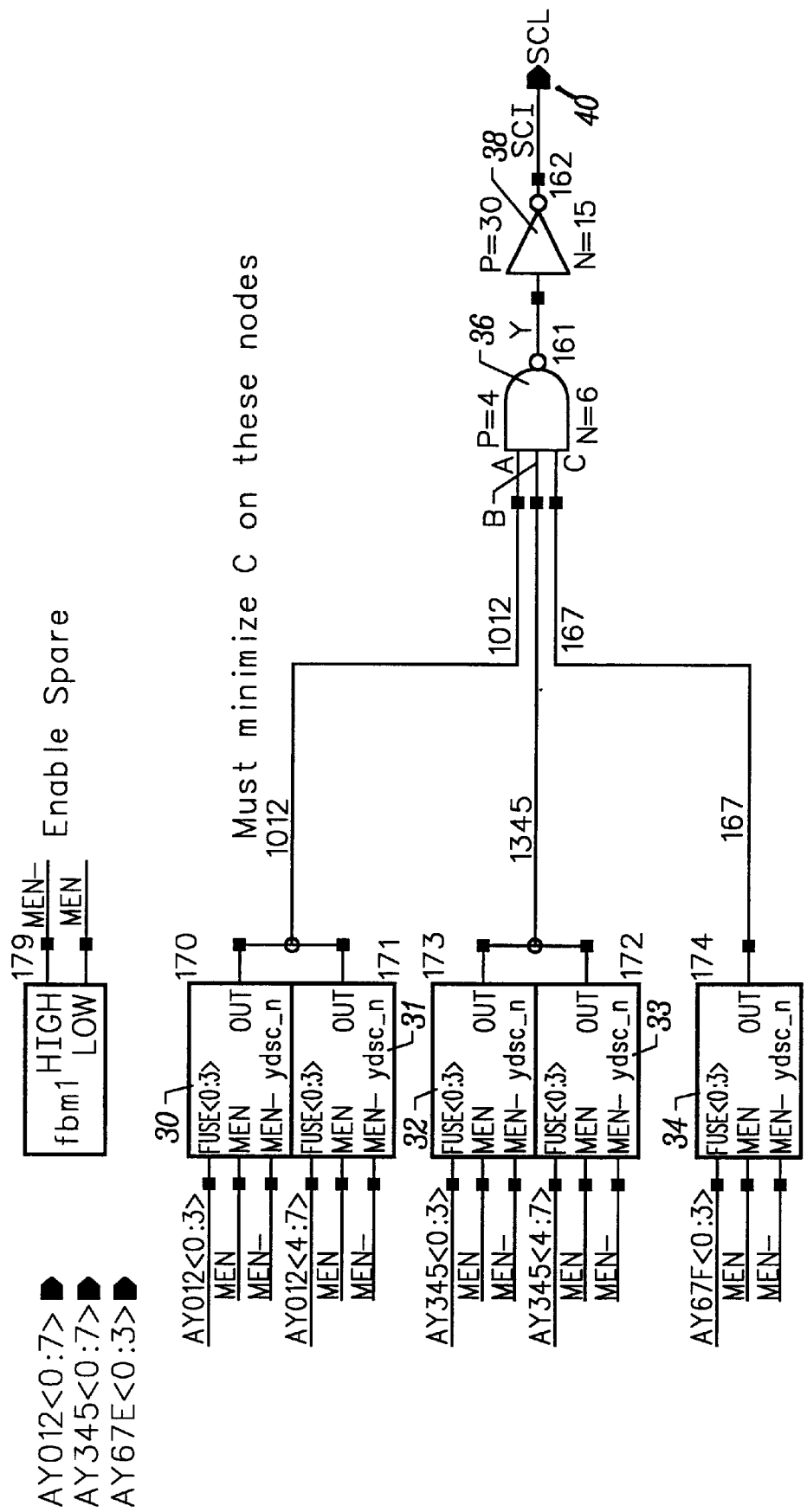
FIG. 2 is a block diagram of a decoder for one spare column line in the memory of FIG. 1.

FIG. 2 is a functional block diagram of a decoder for one spare column select line. The decoder includes a plurality of multiplexers 30–34 each of which receives bits of a Y predecoder signal from predecoder 26 of FIG. 1, whereby all Y predecoder bits are received by muxes 30–34. For example, the top blocks 30, 31 receive 8 bits (0–3 and 4–7) of predecoder signal AY012; middle blocks 32, 33 receive 8 bits (0–3 and 4–7) of predecoder signal AY345; and the bottom block 34 receives 4 bits (0–3) of predecoder signal AY67F. Each mux 30–34 also includes multiplex enable (MEN) and multiplex enable bar ($\overline{\text{MEN}}$) signals for activating the muxes. The MEN and $\overline{\text{MEN}}$ signals are generated by circuitry illustrated in FIG. 4, infra. The output of each mux is applied to a NAND gate 36 with the output of NAND gate 36 applied through inverter 38 as the spare column line activation signal.

Figure 3:
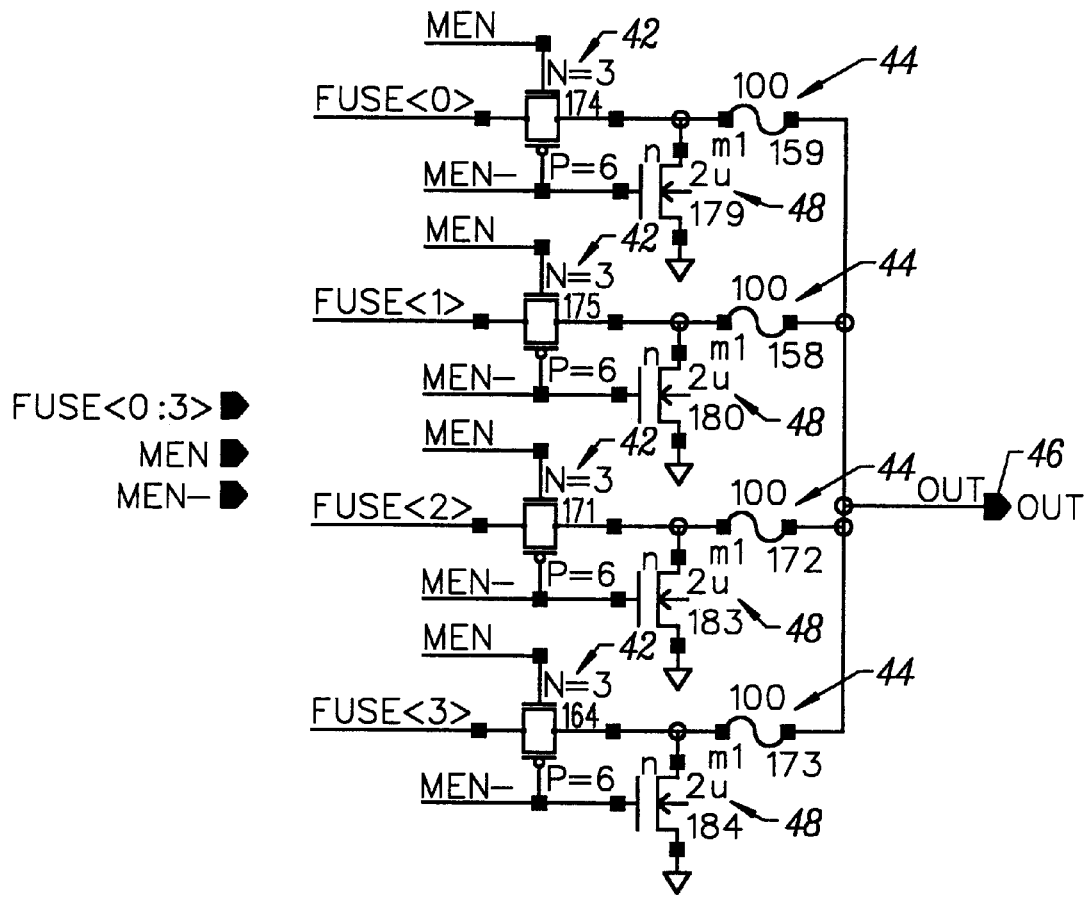
FIG. 3 is a more detailed diagram of decoder elements in FIG. 2.

Each mux 30–34 of FIG. 2 includes a plurality of serially connected pass gates and fuse links with each pass gate connected to receive a bit of the Y predecoder signal. FIG. 3 is a detailed schematic illustrating one mux for receiving 4 bits (0–3) with each bit connectable through a pass gate 42 and fuse link 44 to the output 46. The pass gate 42 comprises parallel connected N and P channel transistors which are controlled respectively by the MEN and $\overline{\text{MEN}}$ signals. An N-channel transistor 48 is controlled by $\overline{\text{MEN}}$ and connects the common terminal of pass gate 42 and fuse link 44 to circuit ground. Thus, when MEN is low and $\overline{\text{MEN}}$ is high, pass gate 42 will not pass the attached signal and N-channel transistor 48 forces the common node to ground. When a column line is identified as defective, the column line is deactivated and a spare column line is enabled. The address for the deactivated column line is passed through the pass gates 42 and selected fuses 44 to the output 46. Fuses for the unselected Y predecoder lines are ablated by laser means so that the output signal responds only to the preselected address for the defective column line. Advantageously, the spare decoder as shown in FIGS. 2 and 3 allows each spare column line to replace any defective column line within the memory array. The prior art limitation of dedicating a spare column line to a limited number of column lines in a sub-array is obviated. Further, since the pass gates are CMOS transistors, no DC power is expended in the spare decoder.

Figure 4:
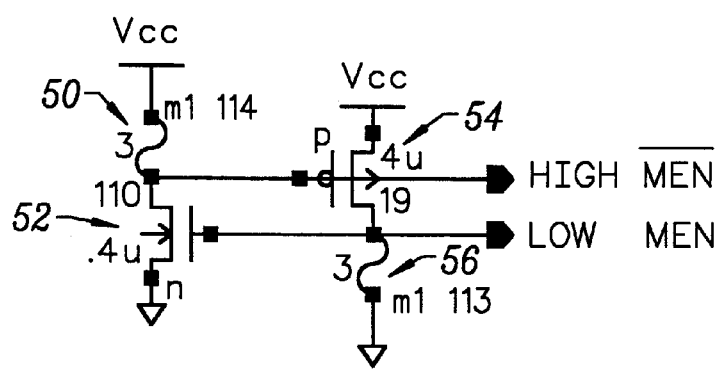
FIG. 4 is a schematic of circuitry for generating enable signals for use with pass gates in the decoder of FIG. 3.

FIG. 4 is a schematic of a circuit for generating the MEN and $\overline{\text{MEN}}$ signals for controlling the pass gates of the multiplexer 30–34. A fuse 50 and a N-channel transistor 52 are serially connected between Vcc and circuit ground, and a P-channel transistor 54 and fuse 56 are serially connected between Vcc and circuit ground. The common terminal of fuse 50 and transistor 52 is connected to the gate of transistor 54 and also to the high output. The common terminal of transistor 54 and fuse 56 is connected to the gate of N-channel transistor 52 and to the low output signal. When fuses 50 and 56 are not blown, a high voltage is applied to the high output or $\overline{\text{MEN}}$. Similarly, when fuse 56 is not blown, a ground is applied to the low output or MEN. In this condition, the muxes 30–34 will not operate. To enable the spare decoder and muxes 30–34, fuses 50 and 56 are ablated by laser, and the output voltages are reversed; transistor 54 becomes conductive and the Vcc voltage is applied to the MEN output. Similarly, transistor 52 becomes conductive and the ground is transmitted to the $\overline{\text{MEN}}$ output. This reversal of the voltages for MEN and $\overline{\text{MEN}}$ will activate the pass gates in the muxes 30–34 and selectively apply addresses to a spare column line through the fuses which are not ablated in the muxes.

There has been described a semiconductor memory circuit employing spare column lines controlled by a spare Y decoder whereby each spare column line can be used for any defective column in the memory array. The use of CMOS pass gates in the spare decode muxes reduces DC power. Further, the use of Y predecoder signals as inputs to the spare decoder obviates the need of extra logic in the spare decode unit. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A decoder for use in addressing a spare column select line for use in a synchronous graphics semiconductor random access memory (SGRAM), the SGRAM having a column predecoder responsive to column addresses with logic for reformatting column addresses, comprising a plurality of multiplexers each having a plurality of input lines connected to column select address lines from the predecoder, each input line including a CMOS pass gate for passing the bit connected thereto in response to an enable signal and a fuse link serially connected with a pass gate, a plurality of fuse links being connected in parallel to provide one of a first plurality of address inputs, a logic gate for receiving outputs from said plurality of multiplexers and generating a spare address signal, whereby all decoder pass gates are disabled until the spare column select line is selected for use, the address for the spare line being defined by ablation of fuse links in unwanted address lines wherein the spare column can replace any defective column in the SGRAM.

2. A synchronous gaphics semiconductor random access memory (SGRAM) comprising a memory array including a plurality of rows and a plurality of columns with memory cells located at crossings of rows and columns, said memory array including a plurality of spare column lines for replacing defective column lines, a row line address decoder for addressing a row line, a column select line decoder for addressing a column line and including a predecoder for reformatting address signals for SGRAM block read and write operations, a plurality of sense amplifiers for sensing data stored at a memory cell defined by an addressed row and an addressed column, and a spare column line decoder for addressing a spare column line using an address for a defective column line, said spare column line decoder including a plurality of multiplexers each having input lines coupled to outputs from the predecoder, each input line including a CMOS pass gate responsive to a spare enable signal and a fuse link serially connected with a pass gate, and a logic gate coupled to the multiplexer outputs and responsive to addresses received by the input lines from the predecoder for generating a spare address signal, whereby each spare column can replace any defective column in the SGRAM.

* * * * *